(12) United States Patent
Lin et al.

(10) Patent No.: US 11,749,968 B2
(45) Date of Patent: *Sep. 5, 2023

(54) DUAL GRATING-COUPLED LASERS

(71) Applicant: II-VI Delaware, Inc., Wilmington, DE (US)

(72) Inventors: Shiyun Lin, San Diego, CA (US); Daniel Mahgerefteh, Los Angeles, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,789

(22) Filed: Jun. 29, 2022

(65) Prior Publication Data

US 2022/0329046 A1  Oct. 13, 2022

Related U.S. Application Data

(63) Continuation of application No. 16/844,598, filed on Apr. 9, 2020, now Pat. No. 11,404,850.

(Continued)

(51) Int. Cl.
*H01S 5/18* (2021.01)
*H01S 5/187* (2006.01)
(Continued)

(52) U.S. Cl.
CPC .............. *H01S 5/187* (2013.01); *G02B 6/124* (2013.01); *G02B 6/12004* (2013.01);
(Continued)

(58) Field of Classification Search
CPC .. G02B 6/12004; G02B 6/124; G02B 6/2935; G02B 2006/12121; G02B 2006/12147;
(Continued)

(56) References Cited

U.S. PATENT DOCUMENTS

| | | |
|---|---|---|
| 4,919,507 A | 4/1990 | Evans et al. |
| 5,003,550 A | 3/1991 | Welch et al. |

(Continued)

FOREIGN PATENT DOCUMENTS

| | | |
|---|---|---|
| CN | 102159975 A | 8/2011 |
| CN | 103430064 A | 12/2013 |

(Continued)

OTHER PUBLICATIONS

European Communication, as issued in connection with European Application No. 15797781.0, dated Jun. 27, 2017, 2pgs.

(Continued)

*Primary Examiner* — Jerry M Blevins
(74) *Attorney, Agent, or Firm* — Blank Rome LLP

(57) ABSTRACT

In an example embodiment, a system includes a first grating-coupled laser (GCL) that includes a first laser cavity optically coupled to a first transmit grating coupler configured to redirect horizontally-propagating first light, received from the first laser cavity, vertically downward and out of the first GCL. The system also includes a second GCL that includes a second laser cavity optically coupled to a second transmit grating coupler configured to transmit second light vertically downward and out of the second GCL. The system also includes a photonic integrated circuit (PIC) that includes a first receive grating coupler optically coupled to a first waveguide and configured to receive the first light and couple the first light into the first waveguide. The PIC also includes a second receive grating coupler optically coupled to a second waveguide and configured to receive the second light and couple the second light into the second waveguide.

20 Claims, 7 Drawing Sheets

Related U.S. Application Data

(60) Provisional application No. 62/836,994, filed on Apr. 22, 2019.

(51) Int. Cl.
  *G02B 6/124* (2006.01)
  *G02B 6/12* (2006.01)
  *G02B 6/293* (2006.01)
  *H01S 5/10* (2021.01)
  *H01S 5/026* (2006.01)
  *H01S 5/00* (2006.01)

(52) U.S. Cl.
  CPC ............ *G02B 6/2935* (2013.01); *H01S 5/005* (2013.01); *H01S 5/026* (2013.01); *H01S 5/1028* (2013.01); *G02B 2006/12121* (2013.01); *G02B 2006/12147* (2013.01)

(58) Field of Classification Search
  CPC .......... H01S 5/187; H01S 5/005; H01S 5/026; H01S 5/1028
  USPC ............................................................ 385/14
  See application file for complete search history.

(56) References Cited

U.S. PATENT DOCUMENTS

| | | |
|---|---|---|
| 6,118,915 A | 9/2000 | Sato |
| 6,282,219 B1 | 8/2001 | Butler et al. |
| 6,730,944 B1 | 5/2004 | Tandon et al. |
| 7,194,016 B2 | 3/2007 | Bullington et al. |
| 7,200,296 B2 | 4/2007 | Kish et al. |
| 7,532,784 B2 | 5/2009 | Tolshikhin et al. |
| 8,041,164 B2 | 10/2011 | Granestrand et al. |
| 8,267,583 B2 | 9/2012 | Yao et al. |
| 8,503,841 B2 | 8/2013 | Kopp et al. |
| 8,660,391 B1 | 2/2014 | Fish |
| 8,699,871 B2 | 4/2014 | Tosetti et al. |
| 8,837,885 B2 | 9/2014 | Seo et al. |
| 9,031,365 B2 | 5/2015 | Park et al. |
| 9,091,827 B2 | 7/2015 | Verslegers et al. |
| 9,405,066 B2 | 8/2016 | Mahgerefteh et al. |
| 9,613,886 B2 | 4/2017 | Lin et al. |
| 9,715,064 B1 | 7/2017 | Gambino et al. |
| 9,847,840 B2 | 12/2017 | Xu et al. |
| 10,243,322 B2 | 3/2019 | Mahgerefteh et al. |
| 10,317,632 B2 | 6/2019 | Mahgerefteh et al. |
| 11,404,850 B2 * | 8/2022 | Lin .................. H01S 5/026 |
| 2002/0131668 A1 | 9/2002 | Marsh et al. |
| 2002/0176463 A1 | 11/2002 | Bullington et al. |
| 2003/0081902 A1 | 5/2003 | Blauvelt et al. |
| 2004/0156589 A1 | 8/2004 | Gunn et al. |
| 2004/0240767 A1 | 12/2004 | Kimura et al. |
| 2005/0147355 A1 | 7/2005 | Ilchenko |
| 2007/0279634 A1 | 12/2007 | Gruhlke et al. |
| 2009/0003762 A1 | 1/2009 | Chiniwalla et al. |
| 2009/0297093 A1 | 12/2009 | Webster et al. |
| 2009/0324163 A1 | 12/2009 | Dougherty et al. |
| 2010/0006784 A1 | 1/2010 | Mack et al. |
| 2011/0091157 A1 | 4/2011 | Yao et al. |
| 2012/0093456 A1 | 4/2012 | Taillaert et al. |
| 2012/0201491 A1 | 8/2012 | Zhou |
| 2012/0268743 A1 | 10/2012 | Wang et al. |
| 2012/0328234 A1 | 12/2012 | Lu et al. |
| 2013/0032281 A1 | 2/2013 | Van Den Berg et al. |
| 2013/0259077 A1 | 10/2013 | Ben Bakir et al. |
| 2013/0322813 A1 | 12/2013 | Grondin et al. |
| 2014/0140655 A1 | 5/2014 | Chakravarty et al. |
| 2014/0140659 A1 | 5/2014 | Demaray |
| 2014/0270620 A1 | 9/2014 | Anderson et al. |
| 2015/0063753 A1 | 3/2015 | Evans et al. |
| 2015/0117808 A1 | 4/2015 | Chen et al. |
| 2015/0177459 A1 | 6/2015 | Van Campenhout et al. |
| 2015/0205062 A1 | 7/2015 | Collins et al. |
| 2015/0260913 A1 | 9/2015 | Li et al. |
| 2015/0260994 A1 | 9/2015 | Akutsu et al. |
| 2015/0286008 A1 | 10/2015 | Shimizu et al. |
| 2015/0316720 A1 | 11/2015 | Yang et al. |
| 2015/0338577 A1 | 11/2015 | Shi et al. |
| 2016/0018601 A1 | 1/2016 | Gardes et al. |
| 2016/0047983 A1 | 2/2016 | Collins et al. |
| 2016/0238793 A1 | 8/2016 | Frankel et al. |
| 2016/0246009 A1 | 8/2016 | Jiang |
| 2016/0294155 A1 | 10/2016 | Zheng et al. |
| 2016/0356956 A1 | 12/2016 | Davoine et al. |
| 2017/0075063 A1 | 3/2017 | Brouckaert et al. |
| 2017/0207600 A1 | 7/2017 | Klamkin et al. |
| 2017/0219783 A1 | 8/2017 | Zhang et al. |
| 2018/0083417 A1 | 3/2018 | Pezeshki et al. |
| 2018/0183513 A1 | 6/2018 | Levesque et al. |
| 2020/0183201 A1 | 6/2020 | Lebby et al. |

FOREIGN PATENT DOCUMENTS

| | | |
|---|---|---|
| EP | 0389172 A2 | 9/1990 |
| EP | 0561672 A1 | 9/1993 |
| EP | 0623980 A2 | 11/1994 |
| EP | 2664949 A2 | 11/2013 |
| JP | H02195309 A | 8/1990 |
| JP | 2000310750 A | 11/2000 |
| JP | 2003510656 A | 3/2003 |
| JP | 2003255166 A | 9/2003 |
| JP | 2003282569 A | 10/2003 |
| JP | 2005115117 A | 4/2005 |
| JP | 2006023385 A | 1/2006 |
| JP | 2006047462 A | 2/2006 |
| JP | 2007052328 A | 3/2007 |
| JP | 2011203604 A | 10/2011 |
| JP | 2013251394 A | 12/2013 |
| JP | 2014081587 A | 5/2014 |
| JP | 2014191301 A | 10/2014 |
| JP | 2015118372 A | 6/2015 |
| KR | 20130104838 A | 9/2013 |
| WO | 2009106139 A1 | 9/2009 |
| WO | 2009106140 A1 | 9/2009 |
| WO | 2010033435 A2 | 3/2010 |
| WO | 2014112077 A1 | 7/2014 |
| WO | 2015063628 A1 | 5/2015 |
| WO | 2016011002 A1 | 1/2016 |
| WO | 2017106880 A1 | 6/2017 |

OTHER PUBLICATIONS

European Communication, as issued in connection with European Application No. 15801046.2, dated Jun. 23, 2017, 2pgs.

International Search Report and Written Opinion dated Jul. 12, 2019, in related PCT Application No. PCT/US2019/031181.

International Search Report and Written Opinion dated Mar. 12, 2020, PCT/US2019/061744.

International Search Report and Written Opinion dated Mar. 20, 2017 in related PCT Application No. PCT/US2016/067634 (16 pages).

International Search Report and Written Opinion dated Mar. 9, 2018, in related PCT Application No. PCT/US2017/064959 (14 pages).

International Search Report and Written Opinion, as issued in connection with International Patent Application No. PCT/US2015/060223, dated May 23, 2016, 13 pgs.

International Search Report and Written Opinion, as issued in connection with International Patent Application No. PCT/US2015/060224, dated May 13, 2016, 11 pgs.

J.H. Abeles et al., "Monolithic High-Power InGaAs/AlGaAs Grating Surface Emitting Fanned-Out Amplifier-Lasers Emitting Monochromatic High-Quality Beams," LEOS '92 Conference Proceedings, Boston, MA, USA, 1992, pp. 521-522.

Korean Preliminary Rejection, as issued in connection with Korean Application No. 10-2017-7016050, dated Jun. 12, 2018, 22 pgs.

Korean Preliminary Rejection, as issued in connection with Korean Application No. 10-2017-7016051, dated Jul. 18, 2017, 12 pgs.

Korean Preliminary Rejection, as issued in connection with Korean Application No. 10-2017-7016051, dated Nov. 16, 2017, 6 pgs.

(56) References Cited

OTHER PUBLICATIONS

Shani et al., "Integrated Optic Adiabatic Devices on Silicon", IEEE Journal of Quantum Electronics, vol. 27, No. 3, Mar. 1991, pp. 556-566.
Shani et al., "Integrated Optic Adiabatic Polarization Splitter on Silicon", Applied Physics Letters, American Institute of Physics, vol. 56, No. 2, Jan. 8, 1990, pp. 120-121.

* cited by examiner

DUAL GRATING-COUPLED LASERS

CROSS-REFERENCE TO RELATED APPLICATION

This application is a continuation of U.S. patent application Ser. No. 16/844,598, filed Apr. 9, 2020, which claims the benefit of and priority to U.S. Provisional App. No. 62/836,994, filed Apr. 22, 2019, the contents of each of which is incorporated herein by reference.

FIELD

The embodiments discussed herein are related to dual grating-coupled lasers.

BACKGROUND

Unless otherwise indicated herein, the materials described herein are not prior art to the claims in the present application and are not admitted to be prior art by inclusion in this section.

High speed data transmission is becoming more and more critical as the amount of data communicated via communication networks increases. High speed data transmission networks may rely on optical transceivers (e.g., optical transmitters or receivers) to facilitate transmission and reception of digital data in the form of optical signals over optical fibers. Optical networks are thus found in a wide variety of high speed applications ranging from modest local area networks ("LANs") to larger networks, such as the Internet. Silicon photonics technology has emerged as a technology for meeting the ever increasing demands on higher speed and higher density for the fiber optic communications.

The subject matter claimed herein is not limited to implementations that solve any disadvantages or that operate only in environments such as those described above. Rather, this background is only provided to illustrate one example technology area where some implementations described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to dual grating-coupled lasers. Dual grating-coupled lasers may be implemented in various optical systems or may be configured for redundant operation.

In an example embodiment, a system may include a first grating-coupled laser (GCL) that includes a first laser cavity optically coupled to a first transmit grating coupler. The first transmit grating coupler may be configured to redirect horizontally-propagating first light, received from the first laser cavity, vertically downward and out of the first GCL. The system may also include a second GCL that includes a second laser cavity optically coupled to a second transmit grating coupler. The second transmit grating coupler may be configured to redirect horizontally-propagating second light, received from the second laser cavity, vertically downward and out of the second GCL. The system may also include a photonic integrated circuit (PIC) that includes a first receive grating coupler optically coupled to a first waveguide. The first receive grating coupler may be configured to receive the first light and couple the first light into the first waveguide. The PIC may also include a second receive grating coupler optically coupled to a second waveguide. The second receive grating coupler may be configured to receive the second light and couple the second light into the second waveguide.

In another example embodiment, a method may include receiving, at a first transmit grating coupler of a first GCL, horizontally-propagating first light from a first laser cavity of the first GCL. The first transmit grating coupler may be optically coupled to the first laser cavity. The method may also include redirecting, at the first transmit grating coupler, the first light vertically downward and out of the first GCL. The method may also include receiving, at a second transmit grating coupler of a second GCL, horizontally-propagating second light from a second laser cavity of the second GCL. The second transmit grating coupler may be optically coupled to the second laser cavity. The method may also include redirecting, at the second transmit grating coupler, the second light vertically downward and out of the second GCL. The method may also include receiving, at a first receive grating coupler of a PIC, the first light. The method may also include coupling, at the first receive grating coupler, the first light into a first waveguide of the PIC. The method may also include receiving, at a second receive grating coupler of the PIC, the second light. The method may also include coupling, at the second receive grating coupler, the second light into a second waveguide of the PIC.

In another example embodiment, a system may include a laser array die and a PIC. The laser array die may include a first dual GCL and a second dual GCL. The first dual GCL may include first and second GCLs and the second dual GCL may include third and fourth GCLs. The first GCL may include a first laser cavity optically coupled to a first transmit grating coupler. The first transmit grating coupler may be configured to redirect horizontally-propagating first light, received from the first laser cavity, vertically downward and out of the first GCL. The second GCL may include a second laser cavity optically coupled to a second transmit grating coupler. The second transmit grating coupler may be configured to redirect horizontally-propagating second light, received from the second laser cavity, vertically downward and out of the second GCL. The third GCL may include a third laser cavity optically coupled to a third transmit grating coupler. The third transmit grating coupler may be configured to redirect horizontally-propagating third light, received from the third laser cavity, vertically downward and out of the third GCL. The fourth GCL may include a fourth laser cavity optically coupled to a fourth transmit grating coupler. The fourth transmit grating coupler may be configured to redirect horizontally-propagating fourth light, received from the fourth laser cavity, vertically downward and out of the fourth GCL. The PIC may include first, second, third, and fourth receive grating couplers. The first receive grating coupler may be optically coupled to a first waveguide in the PIC and may be configured to receive the first light and couple the first light into the first waveguide. The second receive grating coupler may be optically coupled to a second waveguide in the PIC and may be configured to receive the second light and couple the second light into the second waveguide. The third receive grating coupler may be optically coupled to a third waveguide in the PIC and may be configured to receive the third light and couple the third light into the third waveguide. The fourth receive grating coupler may be optically coupled to a fourth waveguide in the PIC and may be configured to receive the fourth light and couple the fourth light into the fourth waveguide.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
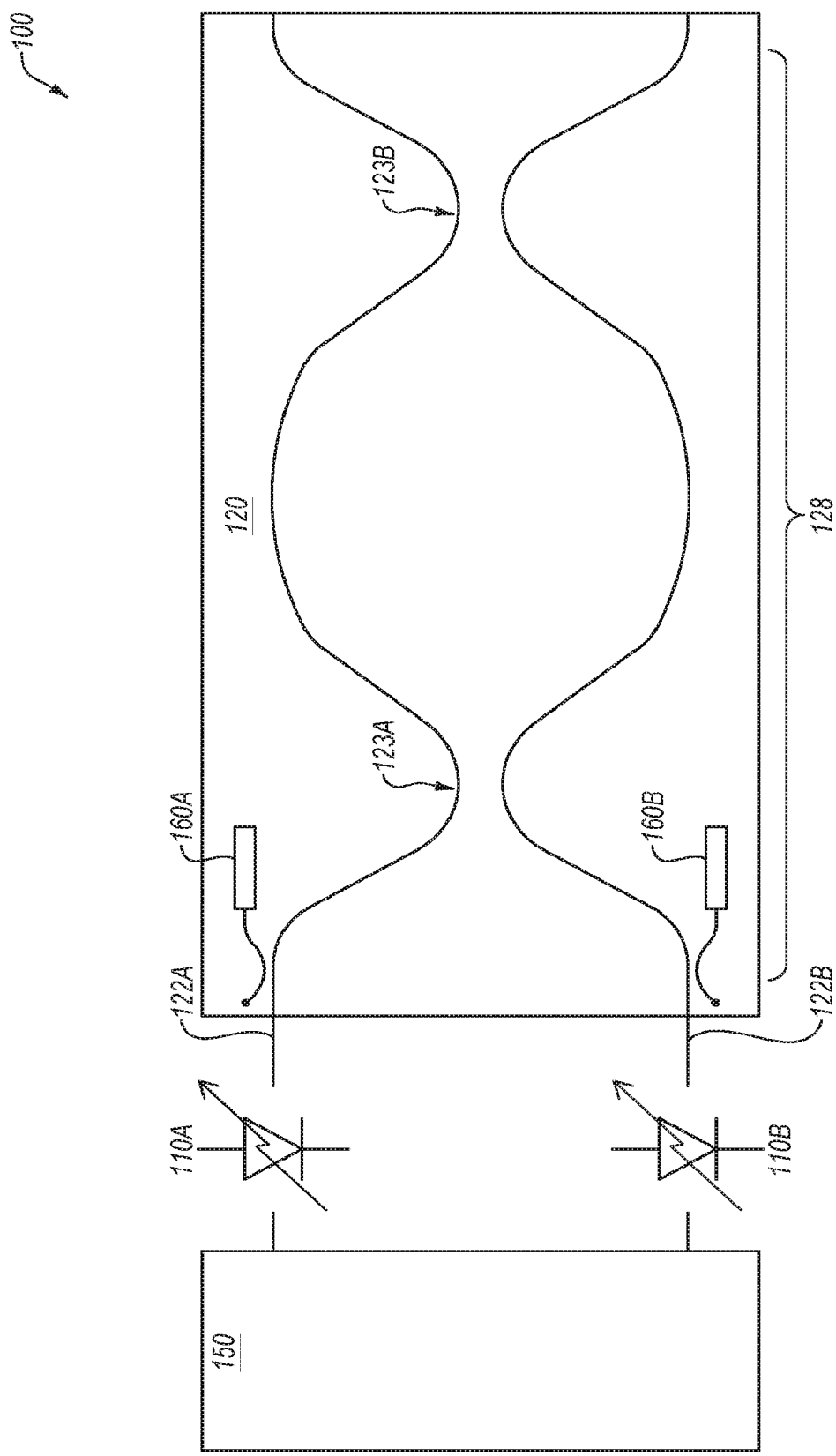
FIG. 1 illustrates an example system that includes two GCLs.

U.S. Pat. No. 9,405,066 issued Aug. 2, 2016, U.S. Pat. No. 10,416,385 issued Sep. 17, 2019 (hereinafter the '385 patent), and U.S. application Ser. No. 16/193,892 filed Nov. 16, 2018 (hereinafter the '892 application) are incorporated herein by reference in their entirety.

Optical transceivers may include an input receiver optical subassembly ("ROSA") and an output transmitter optical subassembly ("TOSA"). The ROSA may include a photodiode or other optical detector to detect optical signals and sensing circuitry to convert the optical signals to electrical signals compatible with other network components. The TOSA may include a laser or other suitable light source to transmit optical signals and may further include control circuitry to modulate the laser according to an input digital data signal and a photodetector to monitor laser power.

Silicon photonics technology has emerged as a technology to meet the ever increasing demands on higher speed and higher density for fiber optic communications. However, higher speed or higher density may result in reliability issues (e.g., for a laser), as an optical transceiver module may be operating constantly at elevated temperatures (e.g., 70 to 90 degrees Celsius) and high laser bias currents. For example, the failure rate for an optical transceiver may be as high as a few percent per year for a typical continuous wave (CW) distributed feedback (DFB) laser operating constantly at, for example, approximately 85 to 90 degrees Celsius with an output power of, for example, approximately 40 to 100 milliwatts (mW).

To increase reliability of fielded optical transceivers, burn-in testing may test optical transceivers before they are fielded. The burn-in testing may be similar to, and in some cases more exacting than conditions of the fielded optical transceivers. Thus, the percentage of optical transceivers that pass burn-in testing, which may be referred to as burn-in yield rate, may be less than 100%, e.g. 90%.

Some embodiments of the present disclosure relate to optical transmitters that include two or more light sources (e.g., lasers) configured for redundant operation. For example, in some embodiments, an optical transmitter may include two or more edge-emitting lasers configured to share components (e.g., coupling optics) (e.g., to reduce the foot print and cost). Further, in some embodiments, the two or more edge-emitting lasers may be included in a single laser die. In these or other embodiments, the two or more edge-emitting lasers may share a common n-contact and each of the two or more edge-emitting lasers may include a p-contact.

In some embodiments, each edge-emitting laser may include a vertically-outcoupled edge-emitting laser, which may alternatively or additionally be referred to as a surface-coupled edge-emitting laser or a grating-coupled laser (GCL or GCL laser). The vertically-outcoupled edge-emitting laser may include a laser cavity and an outcoupler optically coupled to the laser cavity. The outcoupler may be configured to redirect light, which horizontally propagates through the laser cavity, vertically out of the vertically-outcoupled edge-emitting laser. In the present disclosure the terms "vertical" and "vertically" may mean within 30° plus or minus of vertical. Also, in the present disclosure, the terms "horizontal" and "horizontally" may mean within 30° plus or minus of horizontal meaning generally parallel to a substrate or other layers of the GCL. In some embodiments, the vertically-outcoupled edge-emitting laser may be replaced with a vertical-cavity surface-emitting laser (VCSEL) or with a different type of edge-emitting laser such as a distributed feedback (DFB) laser, a distributed Bragg reflector (DBR) laser, a Fabry-Perot (FP) laser, or other suitable laser.

Redundancy may greatly increase burn-in yield rates. For example, a laser with a 90% burn-in yield rate may be improved (e.g. to 99%) by adding a redundant laser. Further, an array of four lasers, where each laser has a 90% burn-in yield rate, may have a burn-in yield rate of 65.61%. However, if each of the four lasers in the array includes a redundant laser, the burn-in yield rate may increase to 96% for the array. Additionally or alternatively, redundancy may greatly reduce laser failure rate. For example, a laser with a 1% failure rate per year may be considered to be very poor. By simply adding a redundant laser, the failure rate may be reduced to, for example, 100 parts per million (ppm) (e.g., a 100× improvement). Similar reduction of wear out failure may also occur.

According to some embodiments, one or more optical transmitters or transceivers described herein may include a Mach-Zehnder optical modulator (MZM) based silicon photonic transceiver or a parallel transceiver module. MZM based silicon photonic transceivers or parallel transceiver modules may be relatively easy to implement and may not need a sophisticated switching integrated circuit (IC) for both transmit and receive. In silicon photonic applications, when one light source starts to fail, the failure may be detected by a monitor photodiode (MPD) on a silicon photonic integrated circuit (PIC), and the module may simply deactivate ("turn-off") the failing light source (e.g., a first GCL laser) and activate ("turn-on") a backup light source (e.g., a second GCL laser). In some embodiments, there may be a brief disruption in data traffic (e.g., in the millisecond range) while switching from one light source to another light source.

Various embodiments may produce optical transceivers that pass burn-in testing at higher rates. Improved burn-in test yield rates may be most dramatically noticeable in applications that include laser arrays. Additionally or alternatively, various embodiments may improve the reliability of optical transceivers by inclusion of a redundant second light source that may be used in the event that the first light source fails. Additionally or alternatively, various embodiments may improve long-term duration of optical transceivers by switching operation back and forth between first and second light sources over time.

Reference will now be made to the drawings to describe various aspects of example embodiments of the invention. The drawings are diagrammatic and schematic representations of such example embodiments, and are not limiting of the present invention, nor are they necessarily drawn to scale.

FIG. 1 illustrates an example system 100 that includes two GCLs according to at least one embodiment described in the present disclosure. The system 100 may include a first GCL 110A and a second GCL 110B (collectively referred to as the GCLs 110 or individually as GCL 110), a PIC 120, and a controller 150. The PIC 120 may include a first waveguide 122A and a second waveguide 122B (collectively referred to as waveguides 122 or individually as waveguide 122), an MZM 128, and a first sensor 160A and a second sensor 160B (collectively referred to as the sensors 160 or individually as sensor 160).

In some embodiments, in general, the controller 150 may be configured to control the operation of the GCLs 110. Based on the control from the controller 150, one of the GCLs 110 (e.g. the first GCL 110A) may be configured to generate light and transmit the light into one of the waveguides 122 of the PIC 120. The sensors 160 may be configured to take a measurement indicative of whether the one of the GCLs 110 is transmitting light, or transmitting light of sufficient power. If the one of the GCLs 110 is not transmitting light or not transmitting light of sufficient power, the controller 150 may be configured to control operation of the other of the GCLs 110, i.e., turn off the one of the GCLs 110 and turn on the other of the GCLs 110 (e.g. the second GCL 110B).

The first waveguide 122A and the second waveguide 122B of the PIC 120 may be configured to split light propagating along the first waveguide 122A such that it propagates along both the first waveguide 122A and the second waveguide 122B or to split light propagating along the second waveguide 122B such that it propagates along both the first waveguide 122A and the second waveguide 122B. For example, the waveguides 122 may include coupling regions 123A and 123B (collectively "coupling regions 123") where the waveguides 122 are sufficiently close that a mode of the light on one of the waveguides 122 may at least partially spread onto the other of the waveguides 122 such that the mode may be split between the two waveguides 122.

The MZM 128 may be configured to modulate the light along the waveguides 122 such that the light transmits data. In particular, the MZM 128 may include an interferometer with two arms, each arm corresponding to a different one of the two waveguides 122. A voltage may be applied to each of the arms of the MZM 128 to modulate, e.g., phase modulate, the portion of light within each of the arms. For example, the voltage of each arm may be modulated with data resulting in two phase-modulated signals, which then interfere with each other at the coupling region 123B and result in an amplitude modulated optical data signal that may be output on one or both of the waveguides 122 following the coupling region 123B.

In some embodiments, the PIC 120 may include a Silicon (Si) PIC that includes multiple layers. Additionally or alternatively, the PIC 120 may include one or more layers that include Silicon Nitride (SiN). The PIC 120 may include one or more adiabatic couplers formed therein to couple light from one waveguide of the PIC 120 to another. Additionally or alternatively, the PIC 120 may include layers that may include or function as cladding.

The PIC 120 may be configured to receive light emitted by the GCLs 110 and couple the light into the waveguides 122. The waveguides 122 may include a waveguide core of any suitable material, for example, Si or SiN, surrounded on one or more sides by cladding of any suitable material, for example, silicon dioxide. The waveguides 122 may be configured to transmit light therein.

The waveguides 122 may draw near to each other in some areas to form coupling regions 123 or may be relatively far from each other in other areas to be optically isolated from one another. In some embodiments, the PIC 120 may include two waveguides 122 as illustrated in FIG. 1. In other embodiments, the PIC 120 may include additional waveguides 122 or other features, e.g., as described in the '892 application.

In some embodiments, the controller 150 may be configured to operate the first GCL 110A and the second GCL 110B in a mutually exclusive manner. For example, the controller 150 may be configured to operate the first GCL 110A for a first duration of time without operating the second GCL 110B. During a second duration of time, the controller 150 may be configured to operate the second GCL 110B without operating the first GCL 110A. The controller 150 may be configured to determine which of the first GCL 110A and the second GCL 110B to operate at any given time. For example, the controller 150 may be configured to operate the second GCL 110B and turn off the first GCL 110A in response to failure of the first GCL 110A. Additionally or alternatively, the controller 150 may be configured to alternate mutually exclusive operation of the first GCL 110A and the second GCL 110B to prolong a lifespan of one or more of the GCLs 110.

In some embodiments, the sensors 160 may be configured for sensing light or other electromagnetic energy propagating through the PIC 120. For example, each sensor 160 may include at least one photodiode, a test access point (TAP), a combination thereof, or any another photosensitive device to monitor the power of signal generated via an active GCL. The sensors 160 may be configured to provide an indication of the operation of one of the GCLs 110 to the controller 150. For example, the sensors 160 may measure a power level and provide an indication of the power level to the controller 150. In some embodiments, the controller 150 may determine that one of the GCLs 110 has failed based on an indication from a corresponding one of the sensors 160.

Figure 2A:
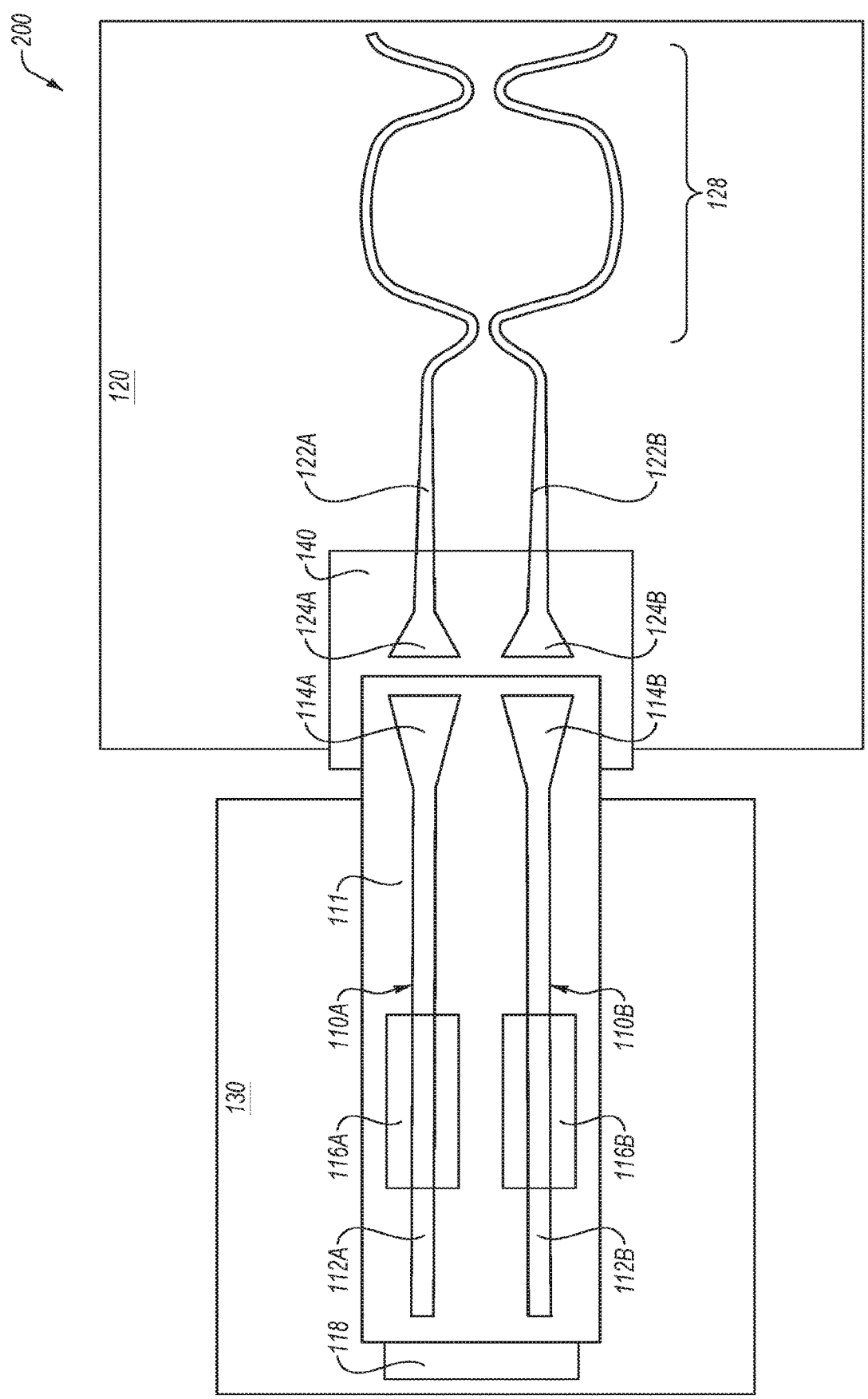
FIGS. 2A and 2B illustrate a top view and a side view of another example system that includes two GCLs.
Figure 2B:
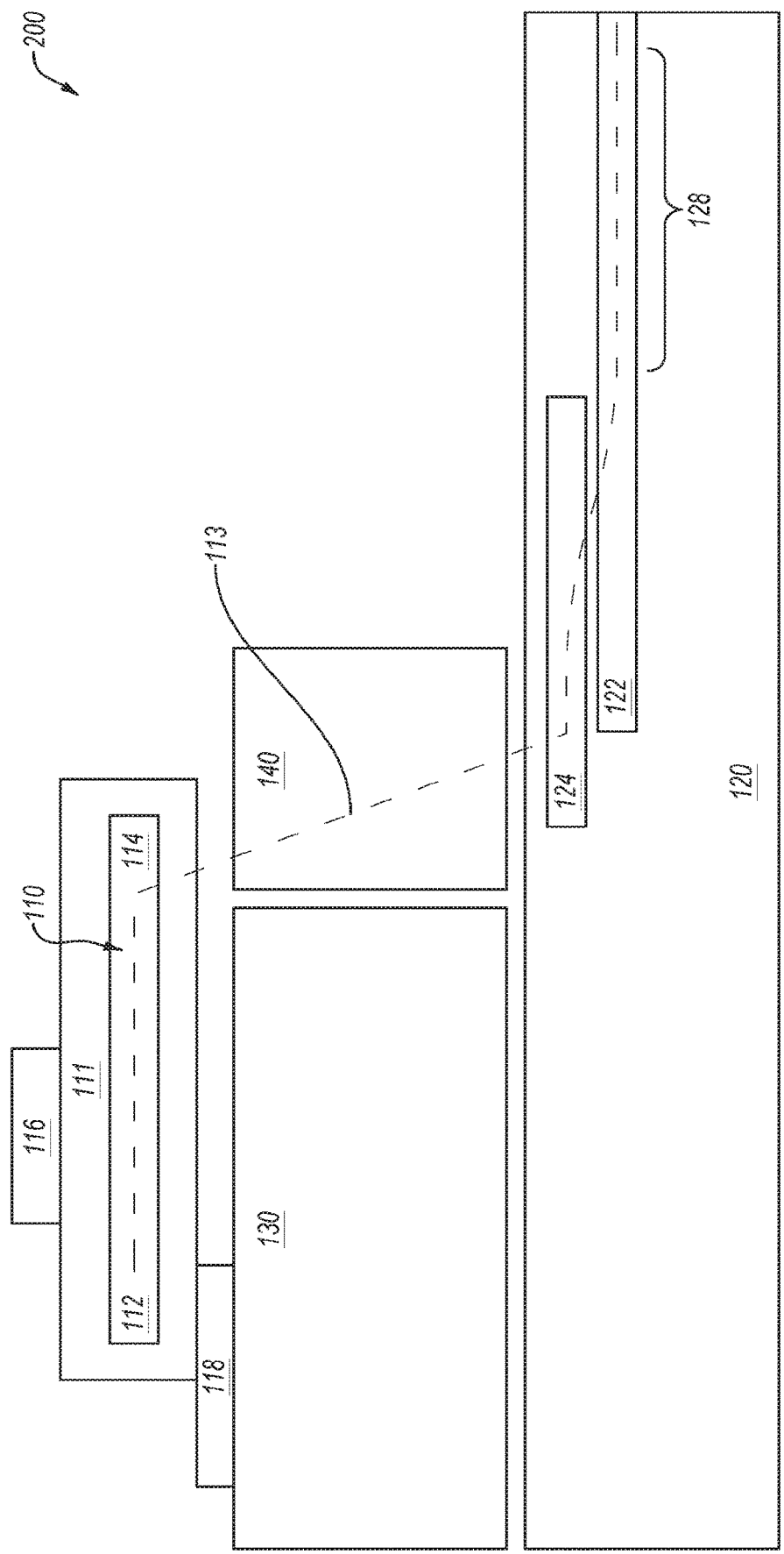

FIGS. 2A and 2B illustrate a top view and a side view of another example system 200 that includes two GCLs 110, according to at least one embodiment described in the present disclosure.

With reference to FIG. 2A and FIG. 2B, the system 200 may include the first GCL 110A and the second GCL 110B positioned on a submount 130. The GCLs 110 may be configured to transmit light vertically downward and into the PIC 120. The system 200 may optionally include an isolator 140 positioned between the GCLs 110 and the PIC 120.

In some embodiments, each of the first GCL 110A and the second GCL 110B may include a laser cavity (e.g. a first laser cavity 112A and a second laser cavity 112B, collectively referred to as the laser cavities 112 or individually as the laser cavity 112). Additionally, each of the first GCL 110A and the second GCL 110B may include a transmit grating coupler (e.g. a first transmit grating coupler 114A and a second transmit grating coupler 114B, collectively referred to as the transmit grating couplers 114 or individually as the transmit grating coupler 114). Each of the laser cavities 112 may be optically coupled to a different one of the transmit grating couplers 114.

In some embodiments, both the first GCL 110A and the second GCL 110B may be included in one laser die 111. For example, both the first GCL 110A and the second GCL 110B may be formed in or on the laser die 111. The laser die 111 may include any suitable material, e.g. indium phosphide (InP), Si, or SiN. Each of the first GCL 110A and the second GCL 110B may be electrically connected to a p-contact (e.g. a first p-contact 116A and a second p-contact 116B, collectively referred to as the p-contacts 116 or individually as the p-contact 116). Both the first GCL 110A and the second GCL 110B may be electrically connected to the n-contact 118. The GCLs 110 may be or include any suitable edge-emitting laser, such as an InP laser.

In some embodiments, the laser cavities 112 may include a gain medium between two reflectors, such as between two DBR mirrors such that the GCLs 110 may include a DBR laser. Additionally or alternatively, the GCLs 110 may each include a DFB laser in which a grating and a gain medium may overlap in the corresponding laser cavity 112. In some embodiments, the GCLs 110 may each include both overlapping grating and gain medium in the corresponding laser cavity 112 and DBR mirrors at opposite ends of the corresponding laser cavity 112, which structure may be referred to as a distributed reflector (DR) laser.

The GCLs 110 may be hermetically sealed by a passivation layer formed by SiN or silicon oxide ($SiO_x$) deposition on the GCLs 110. In more detail, one or more layers of SiN or $SiO_x$ may be deposited over the GCLs 110 to hermetically seal the GCLs 110.

In the example of FIGS. 2A and 2B, the transmit grating couplers 114 each includes a grating configured to redirect horizontally-propagating light from the corresponding laser cavity 112 vertically downward out of the corresponding GCL 110. In the example of FIGS. 2A and 2B, "horizontal" refers to a plane that is parallel to the plane of the page for FIG. 2A and orthogonal to the plane of the page (in and out of the page) for FIG. 2B. The term "horizontally-propagating light" refers specifically to light propagating parallel to the plane of the page and from left to right in the example of FIGS. 2A and 2B. The term "vertical" refers to a direction orthogonal to the horizontal plane, e.g., in and out of the page for FIG. 2A and up and down for FIG. 2B such that "vertically downward" refers to a direction into the page of FIG. 2A and from top to bottom in FIG. 2B.

In some embodiments, the GCLs 110 may be positioned on or mechanically coupled to the submount 130. The submount 130 may be formed of any suitable material, e.g. Si.

In some embodiments, the isolator 140 may be configured to reduce or eliminate back reflection. The isolator 140 may be attached to the GCLs 110, the PIC 120, the submount 130, or any combination thereof. The isolator 140 may include one or more polarizers, one or more half-wave plates, or Garnet or another Faraday Rotator. In other embodiments, the isolator 140 may be omitted from the system 200.

In some embodiments, the PIC 120 may include the first waveguide 122A optically coupled to a first receive grating coupler 124A and the second waveguide 122B optically coupled to a second receive grating coupler 124B. The first receive grating coupler 124A and the second receive grating coupler 124B may be collectively referred to as the receive grating couplers 124 or individually as the receive grating coupler 124.

The receive grating couplers 124 may be configured to couple light received from the GCLs 110 into the waveguides 122. For example, the receive grating couplers 124 may each include a grating configured to redirect vertically downwardly propagating light from the corresponding GCL 110 horizontally and into the waveguides 122. An example optical path that light may follow from the GCL 110 to the waveguide 122 is depicted at 113 in FIG. 2B.

Modifications, additions, or omissions may be made to FIGS. 2A and 2B without departing from the scope of the claimed embodiments. For example, while FIG. 2B illustrates the receive grating couplers 124 formed in a different layer from the waveguides 122, in other embodiments the receive grating couplers 124 may be formed in a same layer as or integrally with the waveguides 122. Further, the transmit grating couplers 114 and the receive grating couplers 124 are illustrated as positive angle grating couplers. In other embodiments, one or both of the transmit grating couplers 114 or the receive grating couplers 124 may be negative angle grating couplers or have other features as disclosed in the '385 patent.

Figure 3:
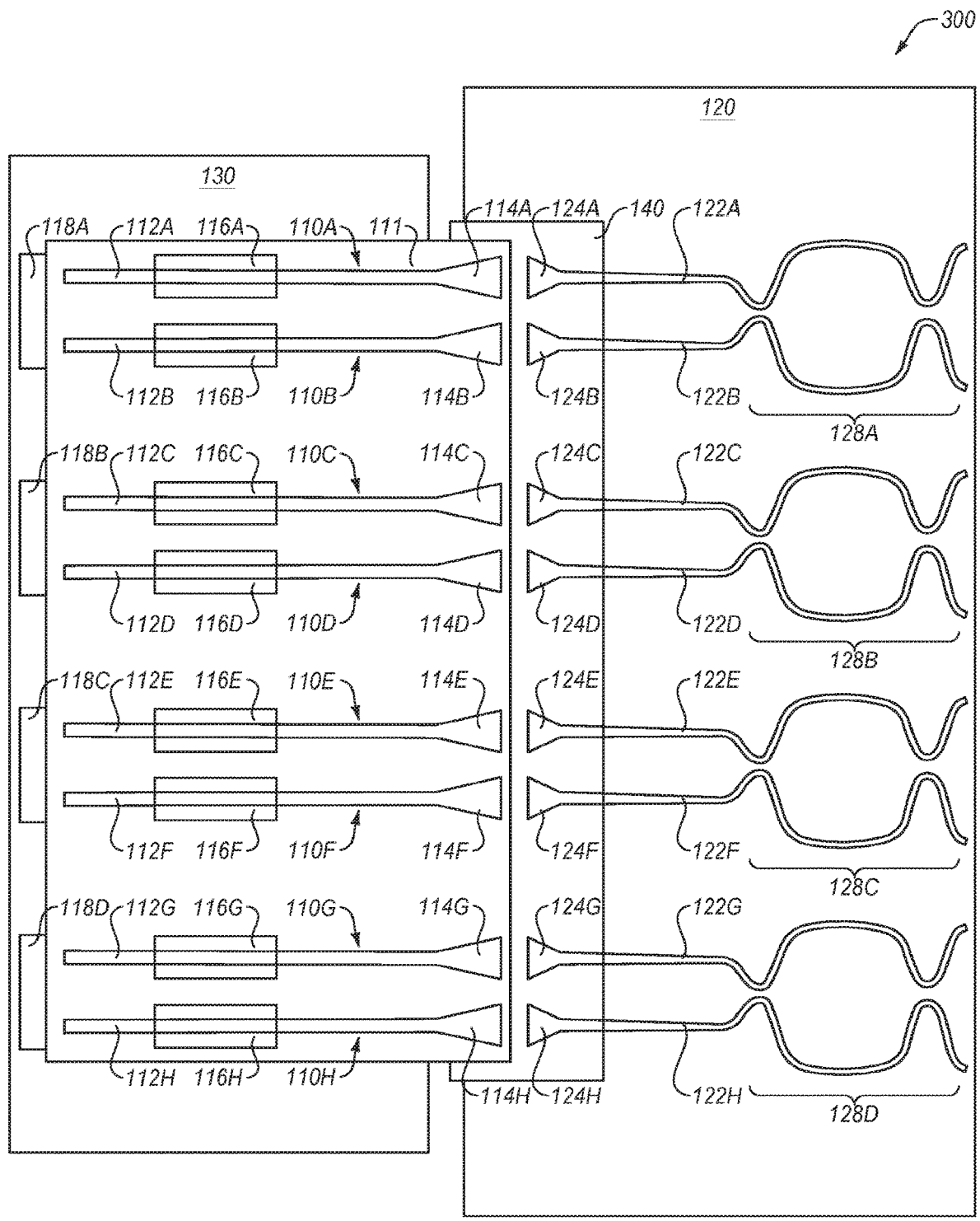
FIG. 3 illustrates an example laser array that includes multiple GCLs.

FIG. 3 illustrates an example laser array 300 that includes multiple GCLs 110A-110H (collectively GCLs 110 or individually GCL 110), according to at least one embodiment described in the present disclosure. The laser array 300 may include multiple (e.g. four) pairs of GCLs 110. For example, a first pair of GCLs 110 in the laser array 300 may include the first GCL 110A and the second GCL 110B, a second pair of GCLs 110 in the laser array 300 may include a third GCL 110C and a fourth GCL 110D, a third pair of GCLs 110 in the laser array 300 may include a fifth GCL 110E and a sixth GCL 110F, and a fourth pair of GCLs 110 in the laser array 300 may include a seventh GCL 110G and an eighth GCL 110H. Aspects of the first pair of GCLs, e.g., the first GCL 110A and the second GCL 110B, have already been described above, and each of the other pairs of GCLs 110 may be the same or substantially similar. For example, each of the GCLs 110 may include a laser cavity 112 (respectively labeled 112A, 112B, . . . 112H in FIG. 3) optically coupled to a transmit grating coupler 114 (respectively labeled 114A, 114B, . . . 114H in FIG. 3). Further, each of the GCLs 110 may be electrically connected to a corresponding p-contact 116 (respectively labeled 116A, 116B, . . . 116H in FIG. 3). Each pair of GCLs 110 may be electrically connected to a corresponding n-contact 118 (respectively labeled 118A, 18B, 118C, and 118D in FIG. 3). For example, the first pair of GCLs (the first GCL 110A and the second GCL 110B) may be electrically connected to a first n-contact 118A and the second pair of GCLs (the third GCL 110C and the fourth GCL 110D) may be electrically connected to a second n-contact 118B.

In some embodiments, each pair of GCLs 110 may be included in the laser die 111. More particularly, all of the GCLs 110 may be included in the same laser die 111. The laser die 111 may be on or mechanically connected to the submount 130.

The laser array 300 may be configured to transmit light from at least one GCL 110 of each pair of GCLs 110, through the isolator 140, and into the PIC 120. The isolator 140 may be configured to reduce or eliminate back reflection of light into the GCLs 110 when light from the GCLs 110 is coupled into the PIC 120.

The PIC 120 may be configured to receive the light from the GCLs 110 and couple the light into the waveguides 122. The PIC 120 may include multiple (e.g. 4) pairs of waveguides 122. For example, a first pair of waveguides 122 in the PIC 120 may include the first waveguide 122A and the second waveguide 122B, a second pair of waveguides 122 in the PIC 120 may include a third waveguide 122C and a fourth waveguide 122D, a third pair of waveguides 122 in the PIC 120 may include a fifth waveguide 122E and a sixth waveguide 122F, and a fourth pair of waveguides 122 in the PIC 120 may include a seventh waveguide 122G and an eighth waveguide 122H. Each of the waveguides 122 may be optically coupled to a corresponding receive grating coupler 124 (respectively labeled 124A, 124B, . . . 124H in FIG. 3). Aspects of the first pair of waveguides 122, e.g., the first waveguide 122A and the second waveguide 122B, and the receive grating couplers 124A and 124B have already been described above, and each of the other pairs of the waveguides 122 and the corresponding receive grating couplers 124 may be the same or substantially similar.

Additionally or alternatively, the PIC 120 may include multiple (e.g. four) MZMs 128 (respectively labeled 128A, 128B, 128C, and 128D in FIG. 3). Aspects of the MZM 128 of FIGS. 1-2B have already been described above and each of the MZMs 128 of FIG. 3 may be the same or substantially similar.

Figure 4:
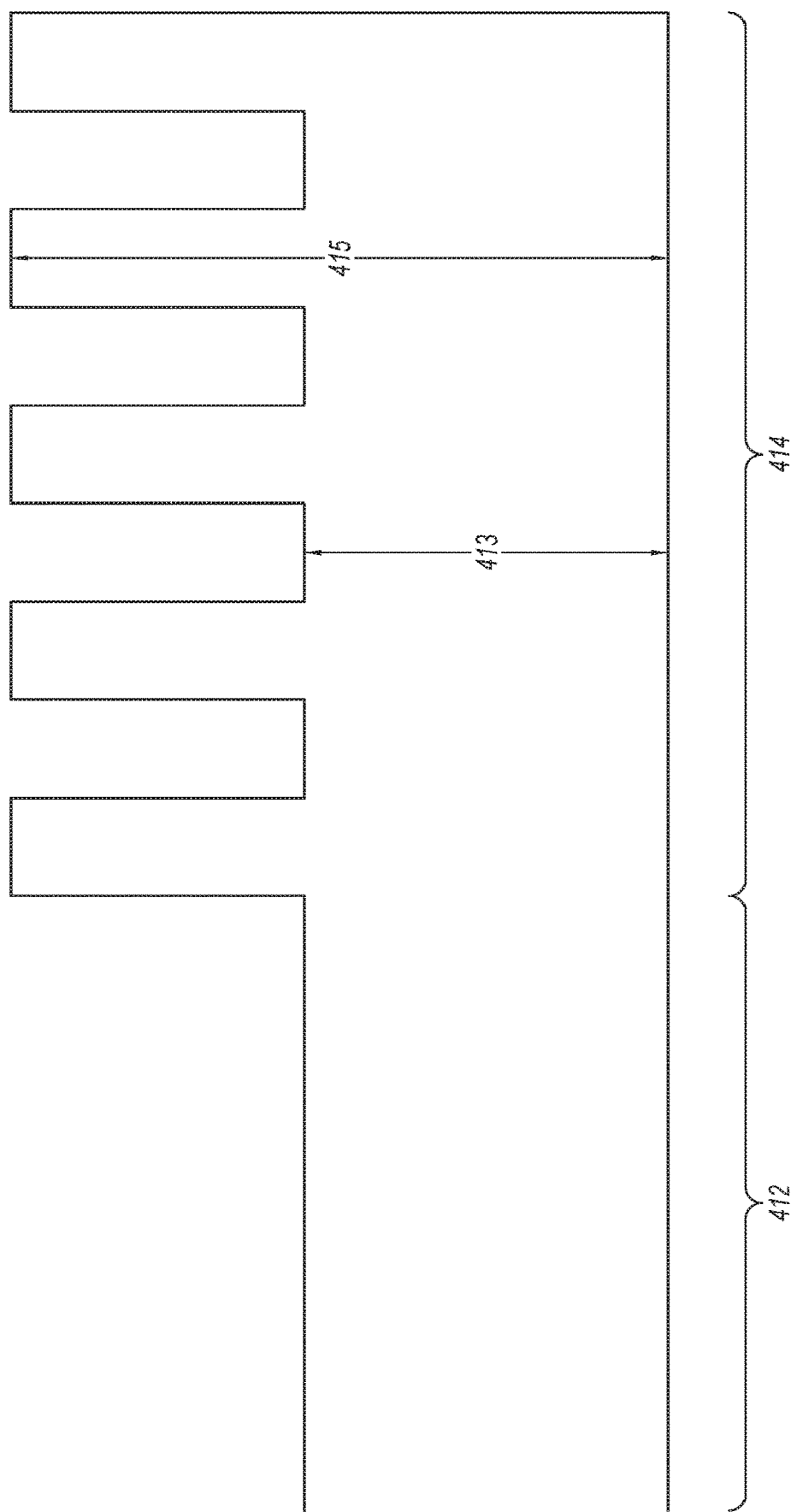
FIG. 4 illustrates an example grating coupler that may be implemented in any of the GCLs of FIGS. 1-3.

Partial etch slab thickness and total tooth height are depicted in FIG. 4, which illustrates an example grating coupler 414, arranged in accordance with at least one embodiment described herein. The grating coupler 414 may be implemented as a transmit grating coupler (e.g. the transmit grating couplers 114 of FIGS. 1-3) or a receive grating coupler (e.g. the receive grating couplers 124 of FIGS. 1-3). The partial etch slab thickness is depicted in FIG. 4 at 413. The total tooth height is depicted in FIG. 4 at 415.

The grating coupler 414 may include a base portion, having a thickness (or height) equal to the partial etch slab thickness 413 and a plurality of teeth with thickness (or height) equal to the total tooth height 415. As is illustrated in FIG. 4, the base portion may have the same thickness (or height) as a waveguide core 412 that is optically coupled to the grating coupler 414. In instances where the grating coupler 414 is implemented as a transmit grating coupler, the waveguide core 412 may be optically coupled to or include a laser cavity (e.g. the laser cavities 112 of FIGS. 1-3). In instances where the grating coupler 414 is implemented as a receive grating coupler, the waveguide core 412 may be implemented as or in a PIC waveguide (e.g. the waveguides 122 of FIGS. 1-3).

Figure 5:
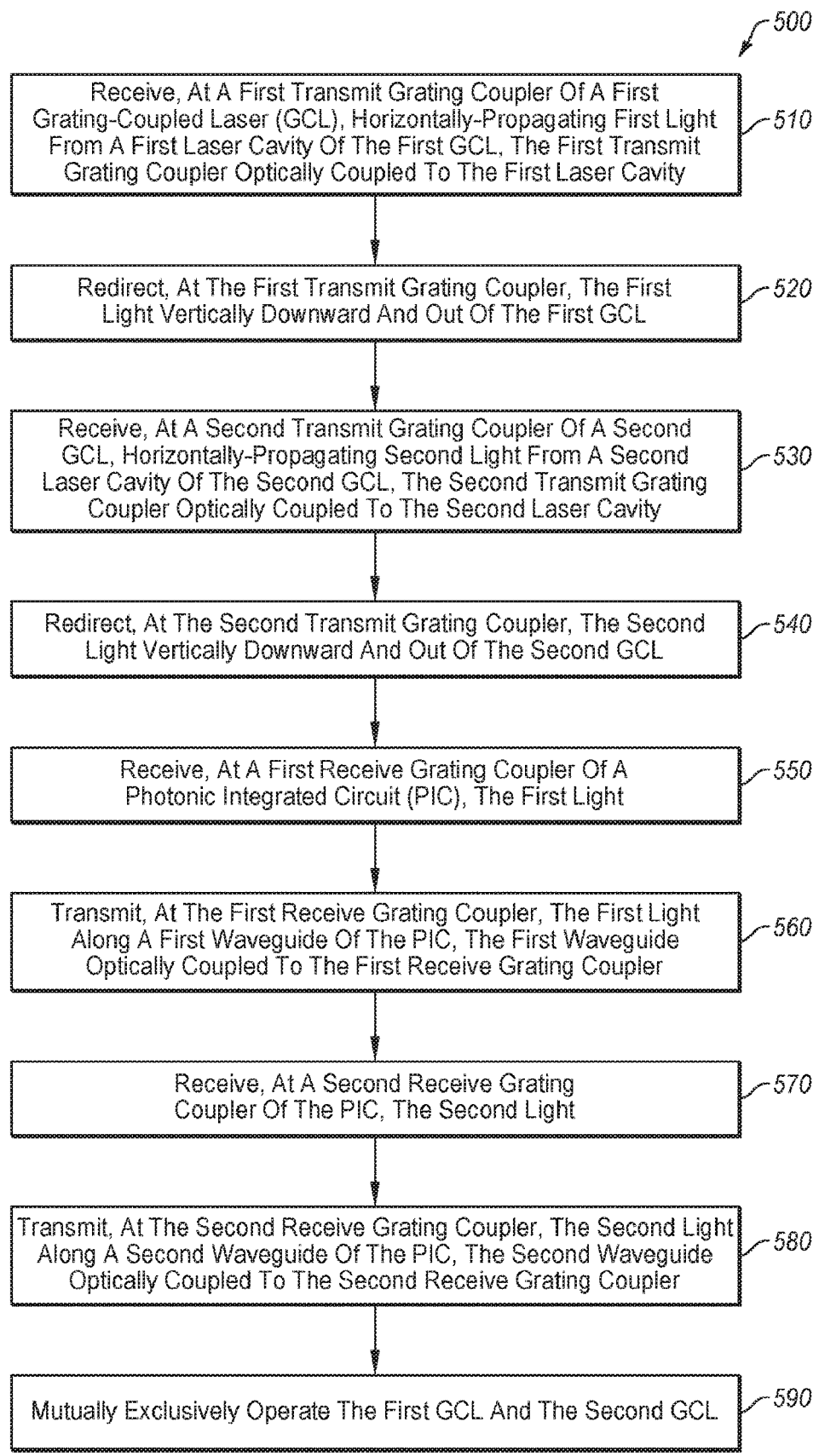
FIG. 5 is a flow chart of an example method to operate a system that includes dual GCLs.

FIG. 5 is a flow chart of an example method 500 to operate a system that includes dual GCLs, according to at least one embodiment described in this disclosure. In some embodiments, one or more of the operations associated with the method 500 may be performed by a portion or all of one or more of the systems 100, 200, or laser array 300 of FIGS. 1-3 respectively. Although illustrated with discrete blocks, the steps and operations associated with one or more of the blocks of the method 500 may be divided into additional blocks, combined into fewer blocks, or eliminated, depending on the desired implementation. The method 500 may begin at a block 510.

At the block 510, horizontally-propagating first light from a first laser cavity of a first GCL may be received at a first transmit grating coupler of the first GCL. The first transmit grating coupler may be optically coupled to the first laser cavity. The first laser cavity 112A of FIGS. 2A and 2B may be an example of the first laser cavity of the block 510. The first transmit grating coupler 114A of FIGS. 2A and 2B may be an example of the first transmit grating coupler of the block 510. The first GCL 110A of FIGS. 2A and 2B may be an example of the first GCL of the block 510. The block 510 may be followed by a block 520.

At the block 520, the first light may be redirected, at the first transmit grating coupler, vertically downward and out of the first GCL. The block 520 may be followed by a block 530.

At the block 530, horizontally-propagating second light from a second laser cavity of a second GCL may be received at a second transmit grating coupler of the second GCL. The second transmit grating coupler may be optically coupled to the second laser cavity. The second laser cavity 112B of FIGS. 2A and 2B may be an example of the second laser cavity of the block 530. The second transmit grating coupler 114B of FIGS. 2A and 2B may be an example of the second transmit grating coupler of the block 530. The second GCL 110B of FIGS. 2A and 2B may be an example of the second GCL of the block 530. The block 530 may be followed by a block 540.

At the block 540, the second light may be redirected, at the second transmit grating coupler, vertically downward and out of the second GCL. The block 540 may be followed by a block 550.

At the block 550, the first light may be received at a first receive grating coupler of a PIC. The PIC 120 of FIGS. 1-2B may be an example of the PIC of the block 550. The first receive grating coupler 124A of FIGS. 2A and 2B may be an example of the first receive grating coupler of the block 550. The block 550 may be followed by a block 560.

At the block 560, the first light may be coupled into a first waveguide of the PIC from the first receive grating coupler. The first waveguide may be optically coupled to the first receive grating coupler. The first waveguide 122A of FIGS. 2A and 2B may be an example of the first waveguide of the block 560. The block 560 may be followed by a block 570.

At the block 570, the second light may be received at a second receive grating coupler of a PIC. The second receive grating coupler 124B of FIGS. 2A and 2B may be an example of the second receive grating coupler of the block 570. The block 570 may be followed by a block 580.

At the block 580, the second light may be coupled into a second waveguide of the PIC from the second receive grating coupler. The second waveguide may be optically coupled to the second receive grating coupler. The second waveguide 122B of FIGS. 2A and 2B may be an example of the second waveguide of the block 580. The block 580 may be followed by a block 590.

At the block 590, the first GCL and the second GCL may be mutually exclusively operated.

For example, the first GCL may be operated without simultaneously operating the second GCL until the first GCL fails or begins to fail. In response to failure of the first GCL, the second GCL may be operated without simultaneously operating the first GCL. Thus, the second GCL may serve as a redundant GCL in the event of failure of the first GCL As another example, the first GCL may be operated without simultaneously operating the second GCL during first durations of time, while the second GCL may be operated without simultaneously operating the first GCL during intervening second durations of time. Such a method of switching between the first and second GCLs may extend a life of a transceiver that includes the first and second GCLs compared to transceivers that have a single optical source as each of the first and second GCLs is operated for only a portion of the aggregate operating time whereas transceivers with a single optical source operate each optical source for the entire operating time of the transceivers.

Alternatively or additionally, one or more of the blocks 510, 520, 530, 540, 550, 560, 570, and 580 or other steps or operations may be performed as part of a burn-in test of various dual GCL laser dies, where each "dual GCL laser die" is a laser die with two GCLs. During the burn-in testing for some of the dual GCL laser dies, one of the GCLs may fail, leaving only one operational GCL. Even so, the dual GCL laser die may still be assembled in an optical transceiver or other package that only requires one laser since the dual GCL laser die still includes one functional GCL. Thus, mutually exclusive operation of the first and second GCL in the block 590 of FIG. 5 may include operation of only the functional GCL to the exclusion of the failed GCL.

In these and other embodiments, a controller, such as the controller 150 of FIG. 1, may analyze or process signals from one or more sensors, such as the sensors 160, to determine if and when a corresponding one of the GCLs has failed or is failing or to determine if a switch from one GCL to another is otherwise warranted, and to respond accordingly. For example, the controller may switch operation from the first GCL to the second GCL if it is determined that the first GCL has failed or is failing. Alternatively or additionally, the controller may switch operation from the first GCL to the second GCL in response to determining that the first GCL has operated for a first predetermined duration, may switch operation from the second GCL back to the first GCL in response to determining that the second GCL has operated for a second predetermined duration, and so on in some embodiments.

Modifications, additions, or omissions may be made to the method 500 without departing from the scope of the present disclosure. Further, the order of operations may vary according to different implementations. For example, the block 590 may occur first e.g. the first GCL may be exclusively operated. Exclusive operation of the first GCL may include the blocks 510, 520, 550, and 560. Following exclusive operation of the first GCL, the block 590 may occur e.g. the second GCL may be exclusively operated. Exclusive operation of the second GCL may include the blocks 530, 540, 570, and 580.

Figure 6:
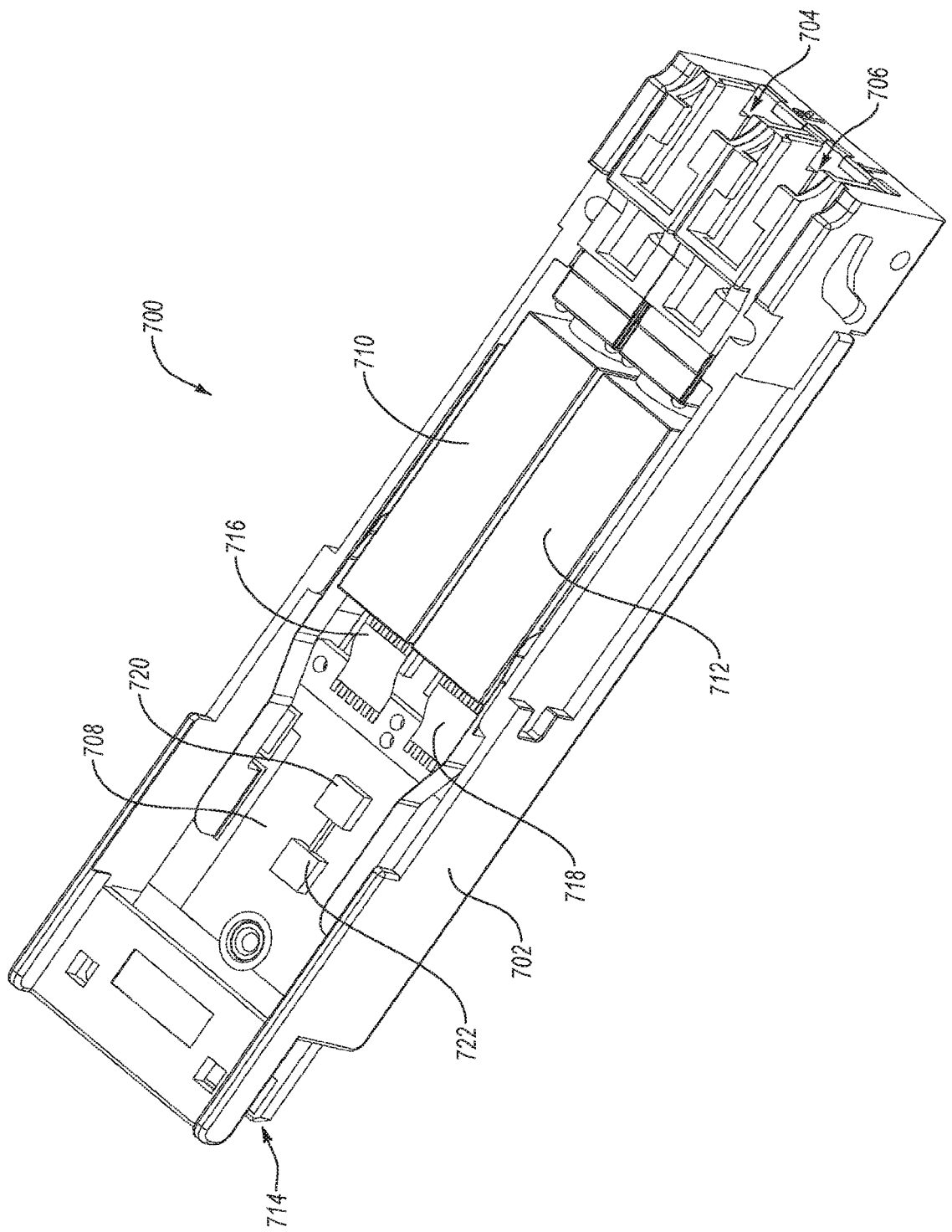
FIG. 6 is a block diagram of an optical transceiver that may include dual GCLs, all arranged in accordance with at least one embodiment described herein.

FIG. 6 illustrates an example optoelectronic module 700 (hereinafter "module 700"), arranged in accordance with at least some embodiments described herein. The module 700 may be configured for use in transmitting and receiving optical signals in connection with a host device (not shown).

As illustrated, the module 700 may include a bottom housing 702, a receive port 704, and a transmit port 706. The module 700 further includes a printed circuit board (PCB) 708 positioned within the bottom housing 702. The PCB 708 includes integrated circuits 720, 722 positioned thereon. In addition, the module 700 includes a ROSA 710 and a TOSA 712 also positioned within the bottom housing 702. An edge connector 714 may be located on an end of the PCB 708 to enable the module 700 to electrically interface with a host device. As such, the PCB 708 may facilitate electrical communication between the host device and the ROSA 710 and between the host device and the TOSA 712. Although not illustrated in FIG. 6, the module 700 may additionally include a top housing that cooperates with the bottom housing 702 to at least partially enclose one or more of the other components of the module 700.

The module 700 may be configured for optical signal transmission and reception at a variety of data rates such as 1 Gb/s, 10 Gb/s, 20 Gb/s, 40 Gb/s, 100 Gb/s, or higher. Furthermore, the module 700 may be configured for optical-signal transmission and reception at various distinct wavelengths using wavelength division multiplexing (WDM) using one of various WDM schemes, such as Coarse WDM, Dense WDM, or Light WDM. Furthermore, the module 700 may be configured to support various communication protocols such as Fibre Channel and High Speed Ethernet. In addition, although illustrated in a particular form factor in FIG. 6, more generally, the module 700 may be configured in any of a variety of different form factors such as the Small Form-factor Pluggable (SFP), the enhanced Small Form-factor Pluggable (SFP+), the 10 Gigabit Small Form Factor Pluggable (XFP), the C Form-factor Pluggable (CFP) and the Quad Small Form-factor Pluggable (QSFP) multi-source agreements (MSAs).

The ROSA 710 may house one or more optical receivers that are electrically coupled to an electrical interface 716. The one or more optical receivers may be configured to convert optical signals received through the receive port 704 into corresponding current electrical signals that are relayed to the integrated circuit 720 through the electrical interface 716 and the PCB 708.

The TOSA 712 may house two or more optical transmitters (e.g., including one or more of systems 100, 200, or laser array 300 of FIGS. 1-3 respectively) that are electrically coupled to another electrical interface 718. The two or more optical transmitters, which may include two GCLs, optionally including at least one as a primary light source and at least one as a redundant light source, may be configured to convert electrical signals received from a host device by way of the PCB 708 and the electrical interface 718 into corresponding optical signals that are transmitted through the transmit port 706.

The integrated circuit 720 may be configured to convert the current electrical signals output by the one or more optical receivers to voltage electrical signals or to equalize the voltage electrical signals. The integrated circuit 720 may drive the equalized voltage electrical signals to a second integrated circuit 722. In some embodiments, the second integrated circuit 722 may be a clock and data recovery (CDR) circuit. In some embodiments, an integrated circuit may be incorporated into the ROSA 710 and may be used to convert current electrical signals to equalized voltage electrical signals. Modifications, additions, or omissions may be made to the module 700 without departing from the scope of the present disclosure.

The module 700 illustrated in FIG. 6 is one architecture in which embodiments of the present disclosure may be employed. This specific architecture is only one of countless architectures in which embodiments may be employed.

Unless specific arrangements described herein are mutually exclusive with one another, the various implementations described herein can be combined in whole or in part to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
a first grating-coupled laser (GCL) having a first laser cavity and a first transmit grating coupler, the first transmit grating coupler optically being coupled to the first laser cavity and being configured to redirect horizontally-propagating first light, received from the first laser cavity, vertically downward and out of the first GCL;
a second GCL having a second laser cavity and a second transmit grating coupler, the second transmit grating coupler being optically coupled to the second laser cavity and configured to redirect horizontally-propagating second light, received from the second laser cavity, vertically downward and out of the second GCL; and
a controller coupled to the first and second GCLs and being configured to repeatedly alternate operation of the first and second GCLs to prolong a lifespan of one or both of the first and second GCLs.

2. The system of claim 1, wherein at least one of:
the controller is configured to operate the first GCL exclusively and to turn off the second GCL in response to failure of the second GCL; and
the controller is configured to operate the second GCL exclusively and to turn off the first GCL in response to failure of the first GCL.

3. The system of claim 1, wherein to repeatedly alternate operation, the controller is configured to mutually exclusively operate the first and second GCLs.

4. The system of claim 1,
wherein the first and second GCLs share a common n-contact;
wherein the first GCL comprises a first p-contact; and
wherein the second GCL comprises a second p-contact.

5. The system of claim 1, further comprising a single laser die having both the first and second GCLs.

6. The system of claim 1, further comprising:
a photonic integrated circuit (PIC) having first and second receive grating couplers,
wherein the first receive grating coupler is optically coupled to a first waveguide and is configured to couple the first light into the first waveguide, and
wherein the second receive grating coupler is optically coupled to a second waveguide and is configured to couple the second light into the second waveguide.

7. The system of claim 6,
wherein the PIC further comprises a Mach Zehnder modulator (MZM) having first and second waveguide arms,
wherein the first waveguide arm is adiabatically coupled to the first waveguide, and
wherein the second waveguide arm is adiabatically coupled to the second waveguide.

8. The system of claim 1,
wherein a first dual GCL includes the first and second GCLs,
wherein the system further comprises a second dual GCL having third and fourth GCLs,
wherein the third GCL has a third laser cavity and a third transmit grating coupler,
wherein the third transmit grating coupler is optically coupled to the third laser cavity and is configured to redirect horizontally-propagating third light, received from the third laser cavity, vertically downward and out of the third GCL,
wherein the fourth GCL has a fourth laser cavity and a fourth transmit grating coupler,
wherein the fourth transmit grating coupler is optically coupled to the fourth laser cavity and is configured to redirect horizontally-propagating fourth light, received from the fourth laser cavity, vertically downward and out of the fourth GCL.

9. A method comprising
operating a first grating-coupled laser (GCL) by:
horizontally-propagating first light from a first laser cavity of the first GCL, and redirecting the first light, vertically downward and out of the first GCL, at a first transmit grating coupler optically coupled to the first laser cavity;
operating a second GCL by:
horizontally-propagating second light from a second laser cavity of the second GCL, and redirecting the second light, vertically downward and out of the second GCL, at a second transmit grating coupler optically coupled to the second laser cavity; and prolonging a lifespan of one or both of the first and second GCLs by repeatedly alternating operation of the first and second GCLs.

10. The method of claim 9, comprising one of:
operating the first GCL exclusively and turning off the second GCL in response to failure of the second GCL; and
operating the second GCL exclusively and turning off the first GCL in response to failure of the first GCL.

11. The method of claim 9, wherein repeatedly alternating operation of the first and second GCLs comprises repeatedly alternating mutually exclusive operation of the first and second GCLs.

12. The method of claim 9, further comprising:
analyzing signals from one or more sensors;
determining, based on the analyzing, that a given one of the first and second GCLs has a failure; and
operating the other one of the first and second GCLs to exclusion of the given one in response to the determination of the failure.

13. The method of claim 9, comprising providing both the first and second GCLs in a single laser die.

14. The method of claim 9, wherein operating the first and second GCLs comprises using a common n-contact between the first and second GCLs, using a first p-contact for the first GCL, and using a second p-contact for the second GCL.

15. The method of claim 9,
wherein operating the first GCL comprises:
receiving, at a first receive grating coupler of a photonic integrated circuit (PIC), the first light; and
coupling, at the first receive grating coupler, the first light into a first waveguide of the PIC; and
wherein operating the second GCL comprises:
receiving, at a second receive grating coupler of the PIC, the second light; and
coupling, at the second receive grating coupler, the second light into a second waveguide of the PIC.

16. The method of claim 15,
wherein operating the first GCL comprises adiabatically coupling the first light from the first waveguide to a first waveguide arm of a Mach Zehnder modulator (MZM); and
wherein operating the second GCL comprises adiabatically coupling the second light from the second waveguide to a second waveguide arm of the MZM.

17. A system comprising:
a first grating-coupled laser (GCL) having a first p-contact, a first laser cavity, and a first transmit grating coupler, the first transmit grating coupler being optically coupled to the first laser cavity and configured to redirect horizontally-propagating first light, received from the first laser cavity, vertically downward and out of the first GCL; and
a second GCL having a second p-contact, a second laser cavity, and a second transmit grating coupler, the second transmit grating coupler being optically coupled to the second laser cavity and configured to redirect horizontally-propagating second light, received from the second laser cavity, vertically downward and out of the second GCL;
wherein the first and second GCLs share a common n-contact.

18. The system of claim 17, further comprising a controller coupled to the first and second GCLs,
wherein the controller is configured to one of:
repeatedly alternate operation of the first and second GCLs to prolong a lifespan of one or both of the first and second GCLs;
mutually exclusively operate the first and second GCLs to prolong the lifespan of one or both of the first and second GCLs;
operate the first GCL exclusively and to turn off the second GCL in response to failure of the second GCL; and
operate the second GCL exclusively and to turn off the first GCL in response to failure of the first GCL.

19. A method comprising
operating a first grating-coupled laser (GCL) by:
using a first p-contact of the first GCL and a common n-contact;
horizontally-propagating first light from a first laser cavity of the first GCL; and
redirecting the first light, vertically downward and out of the first GCL, at a first transmit grating coupler optically coupled to the first laser cavity; and
operating a second GCL by:
a second p-contact of the second GCL and the common n-contact shared with the first GCL;
horizontally-propagating second light from a second laser cavity of the second GCL; and
redirecting the second light, vertically downward and out of the second GCL, at a second transmit grating coupler optically coupled to the second laser cavity.

20. The method of claim 19, further comprising one of:
prolonging a lifespan of one or both of the first and second GCLs by repeatedly alternating operation of the first and second GCLs;
prolonging the lifespan of one or both of the first and second GCLs by repeatedly alternating mutually exclusive operation of the first and second GCLs;
operating the first GCL exclusively and turning off the second GCL in response to failure of the second GCL; and
operating the second GCL exclusively and turning off the first GCL in response to failure of the first GCL.

* * * * *